United States Patent [19]
Geil

[11] Patent Number: 5,226,716
[45] Date of Patent: Jul. 13, 1993

[54] LOCKING DEVICE FOR ELECTRONIC MODULE

[75] Inventor: Ronald J. Geil, Vermilion, Ohio

[73] Assignee: Gould Inc., Eastlake, Ohio

[21] Appl. No.: 742,914

[22] Filed: Aug. 9, 1991

[51] Int. Cl.$^5$ .................................... A47B 88/00
[52] U.S. Cl. ............................. 312/333; 292/256.73; 292/64
[58] Field of Search .................. 292/64, 256.73; 312/333, 215

[56] References Cited

U.S. PATENT DOCUMENTS

| | | | |
|---|---|---|---|
| 3,050,358 | 8/1962 | Jongbloed-Unterhorst | 312/333 |
| 3,191,097 | 6/1965 | Dano et al. | 312/333 |
| 3,199,938 | 8/1965 | Vouk | 312/333 |
| 3,299,324 | 1/1967 | Yarbrough | 312/333 |
| 3,774,946 | 11/1973 | Hammann | 292/256.73 |
| 3,831,064 | 8/1974 | Keller . | |

FOREIGN PATENT DOCUMENTS

| | | |
|---|---|---|
| 2619340 | 10/1977 | Fed. Rep. of Germany . |
| 1572503 | 6/1969 | France . |
| 2130821 | 11/1972 | France . |

Primary Examiner—Kenneth J. Dorner
Assistant Examiner—Gerald A. Anderson
Attorney, Agent, or Firm—D. Peter Hochberg; Mark Kusner

[57] ABSTRACT

A locking assembly for releasably securing an electronic module within a host instrument comprising a body portion, aligning elements for aligning the body portion relative to the host instrument and a fastening member associated with the body portion for mounting the body portion to the host instrument. The fastening member is operable to gradually urge the body portion in a direction for electrical engagement between the module and the host instrument. A latch member is mounted to the fastening member and a frictional element is disposed between the fastening member and the latch member. The frictional element frictionally engages the fastening member and the latch member is operable to cause the latch member to move with the fastening member as a result of the frictional engagement therebetween. Movement of the latch member is limited between a first position wherein the latch member projects outward from the body portion and is operably aligned to engage a first surface on the module and a second position wherein the latch member is removed from alignment with the module. The latch member is movable to the first position when the fastening member urges the body portion in the direction of electrical engagement and is movable to the second position when the fastening member urges the body portion in a direction opposite the direction for electrical engagement.

14 Claims, 6 Drawing Sheets

LOCKING DEVICE FOR ELECTRONIC MODULE

FIELD OF THE INVENTION

The present invention relates generally to electronic equipment, and more particularly to a locking arrangement for releasably securing a replaceable electronic module with a host electronic instrument. The present invention is particularly applicable to securing replaceable modules in a portable recording instrument and will be described with particular reference thereto, although it will be appreciated that the present invention finds advantageous application in securing and removing various electronic components in electrical devices.

BACKGROUND OF THE INVENTION

Many electronic instruments such as, for example, a portable oscillographic recorder are provided with openings or slots to receive removable electronic components containing specialized electrical circuitry. In the case of an oscillographic recorder, such components may be a recorder preamplifier module, which is generally rectangular in shape and typically include a front panel at one end thereof which is to be exposed on the control face of the host recorder and a multi-pin connector on the other end thereof for electrical engagement with a mating connector within the recorder.

It has been known to mount such modules to the oscillographic recorder by means of a threaded fastener extending through a tab or flange provided on the front panel of the module. In this respect, the threaded fastener extends through the tab or flange on the front panel and is received within a threaded opening in a bracket or support within the recorder. With such a configuration, the module is inserted into the recorder until the connector thereon engages the connector within the recorder and the threaded fastener is used to secure the module in place. Typically, with such arrangements, the threaded fastener must be completely removed from the module and recorder to remove the module from the instrument.

Another arrangement for mounting modules to an oscillographic recorder of similar electrical instruments comprises a spring loaded latch mounted to the recorder which is operable to engage a tab projecting outward from the surface of the module to lock it in place against a biasing force acting against the module. In this respect, biasing springs are typically provided above and below the connector within the recorder to engage the back panel of the module and to force the module in an electrically non-engaging direction. The tab on the module is positioned so as to engage the latch wherein the module is confined between the latch and the biasing springs. In other words, the module is inserted into the recorder against the biasing force of the springs within the recorder and when such springs have been compressed a sufficient amount, the latching element engages the tab on the surface of the module to retain same within the recorder.

A problem with such an arrangement, however, is that the biasing springs on the recorder tend to force the module and the connector thereon away from the connector mounted within the recorder i.e. out of electrical engagement. More importantly, when inserting the module into the recorder, sufficient force must be exerted on the module to overcome the opposed biasing force of the biasing springs so as to enable the latch on the front face of the recorder to catch the upward projecting tab on the module. In this respect, damage to the connecting pins on the connector can occur as a result of the force necessary in overcoming the forces of the biasing spring.

The present invention overcomes these problems by providing a locking assembly for releasably mounting an electronic module to a host instrument, which locking assembly may be permanently mounted to the host instrument and which fixedly positions modules with the host instrument and gradually moves the electronic module into and out of electrical engagement with the host instrument.

SUMMARY OF THE INVENTION

In accordance with the present invention, there is provided an assembly for mounting an electronic module within a host instrument wherein the electronic module has an electrical connector extending therefrom for engagement with an electrical connector within the host instrument. The mounting assembly comprises aligning means for aligning the module in the housing wherein the module is movable in a direction for electrical engagement of the connector on the module with the connector within the instrument. The module includes first surface means oriented so as to be generally transverse to and facing opposite the direction for electrical engagement, and second surface means spaced apart from the first surface means which are generally transverse to and faces in the direction for an electrical engagement. A locking assembly for releasably securing the module within the instrument is provided and includes a locking/extractor member and reversible fastening means for mounting the locking/extractor member to the instrument. The fastening means are operable to gradually urge the locking/extractor member in the direction for an electrical engagement and in a direction opposite thereto. The locking/extractor member includes a latch member movable between a first position wherein the latch member is operably aligned with the module to engage the first surface means on the module when the locking/extractor member moves in the direction for electrical engagement, and a second position wherein the latch member is removed from alignment with the module when the locking/extractor member moves opposite the direction for electrical engagement. The locking/extractor member further includes an extractor surface operable to engage the second surface means on the module when the clamp member moves opposite the direction for electrical engagement.

In accordance with another aspect of the present invention, there is provided a locking assembly for releasably securing an electronic module within a host instrument comprising a body portion, aligning means for aligning the body portion relative to the host instrument and reversible fastener means associated with the body portion for mounting the body portion to the host instrument. The fastening means is operable to gradually urge the body portion in a direction for electrical engagement between the module and the host instrument. A latch member is mounted to the fastening means and a frictional element is disposed between the fastening means and the latch member. The frictional element frictionally engages the fastening means and the latch member and is operable to cause the latch member to move with the fastening means as a result of the frictional engagement therebetween. Movement of the latch member is limited between a first position wherein the latch member projects outward from the body portion and is operably aligned to engage a first surface on the module and a second position wherein the latch member is removed from alignment with the module. The latch member is movable to the first position when the fastening means urges the body portion in the direction for electrical engagement and is movable to the second position when the fastening member urges the body portion in a direction opposite to the direction for electrical engagement.

In accordance with another object of the present invention, there is provided an electronic module mounting assembly for releasably retaining an electronic module within a host instrument. The mounting assembly includes an electronic module dimensioned to be received within the host instrument in a predetermined direction of engagement. The module has a first surface means oriented to be generally transverse and facing opposite to the direction of engagement and a second surface being spaced apart from the first surface and being generally transverse to and facing in the direction of engagement. A locking assembly mountable to the host instrument is provided for releasably holding the module within the host instrument. The locking assembly includes a locking/extractor member, and reversible fastening means for mounting the locking/extractor member to the instrument. The fastening means is operable to gradually urge the locking/extractor member in the direction of engagement or in a direction opposite thereto. A latch member is provided and movable between a first position wherein the latch member is operably aligned with the module to engage the first surface means on the module when the fastening means urges the locking/extractor member in the direction of engagement, and a second position wherein the latch member is removed from alignment with the module when the fastening means urges the locking/extractor member opposite the direction of engagement. Extractor surface means are provided on the locking/extractor member and are operable to engage the second surface means on the module when the fastening means urges the locking/extractor member opposite the direction for electrical engagement.

It is an object of the present invention to provide a locking device for releasably retaining an electronic module within a host instrument.

Another object of the present invention is to provide module locking assembly for securing an electronic module having an electrical connector thereon in a host instrument having an electrical connection therein, which locking assembly permits gradual engagement and separation between the connector on the module and the connector within the host instrument.

Another object of the present invention is to provide an assembly as described above which minimizes the engagement and separation force exerted on the respective connectors on the module and within the host instrument.

A still further object of the present invention is to provide a device as described above which provides more positive locking between the connector on the module and the connector within the host instrument.

A still further object of the present invention is to provide a locking device as described above which is less expensive and more reliable than devices known heretofore.

These and other objects and advantages will become apparent from the following description of a preferred embodiment of the invention taken together with the accompanying drawings.

BRIEF DESCRIPTION OF DRAWINGS

The invention may take form in certain parts and arrangement of parts, an embodiment of which shall be described in detail in the specification, and illustrated in the accompanying drawings wherein.

DETAILED DESCRIPTION OF PREFERRED EMBODIMENT

Figure 1:
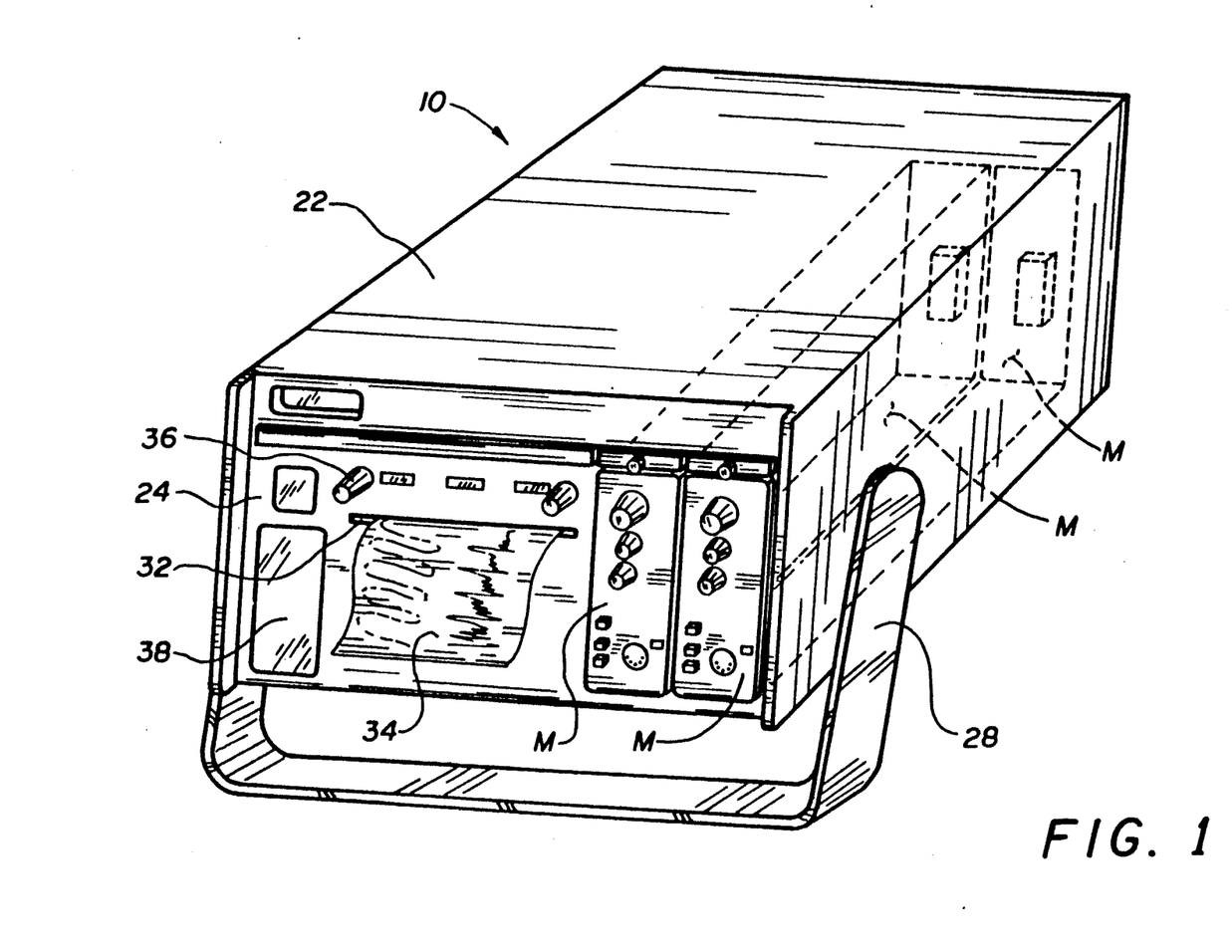
FIG. 1 is a prospective view of a recording instrument showing, in phantom, removable electronic modules.

Referring now to the drawings wherein the showings are for the purposes of illustrating a preferred embodiment of the present invention, and not for the purpose of limiting same, FIG. 1 generally shows a portable oscillographic recorder 10 including two removable electronic modules, designated "M" in the drawings. Recorder 10 in and of itself forms no part of the present invention, but is illustrative of a device with which the present invention finds advantageous application. Accordingly, recorder 10 shall not be described in great detail. Basically, recorder 10 typically includes a generally rectangular housing 22 having a front panel 24 and a back panel 26 (best seen in FIGS. 2A and 2B). A conventional handle/support 28, typically found on portable recording instruments, is attached to housing 22 by conventional means. Front panel 24 is shown including a slot 32 through which a recorder chart 34 is fed by an internal recording and printing mechanism (not shown). Printer stylist control/position knobs 36 are shown together with sensitivity meters 38.

In the embodiment shown, recorder 10 includes slots or openings to receive two modules "M" side-by-side. Modules "M", which are illustrated in phantom in FIG. 1, are dimensioned to be removable from housing 22 and typically contain specialized electronic circuitry, such as an amplifier circuit, for use with the host recording instrument 10. The specific circuitry within modules "M" form no part of the present invention. Module "M" has a generally rectangular body 52 having a front face panel 54 at one end thereof and an electrical connector 56 at the other end thereof. Connector 56 on module "M" is adapted to matingly engage an electrical connector 46 within housing 22 of host recording instrument 10. Connector 46 is mounted to an electrical circuit board 44 which is attached to rear panel 26 of housing 22. Connectors 56 and 46 are generally multi-pin connectors typically used in electrically connecting electronic modules.

Figure 2A:
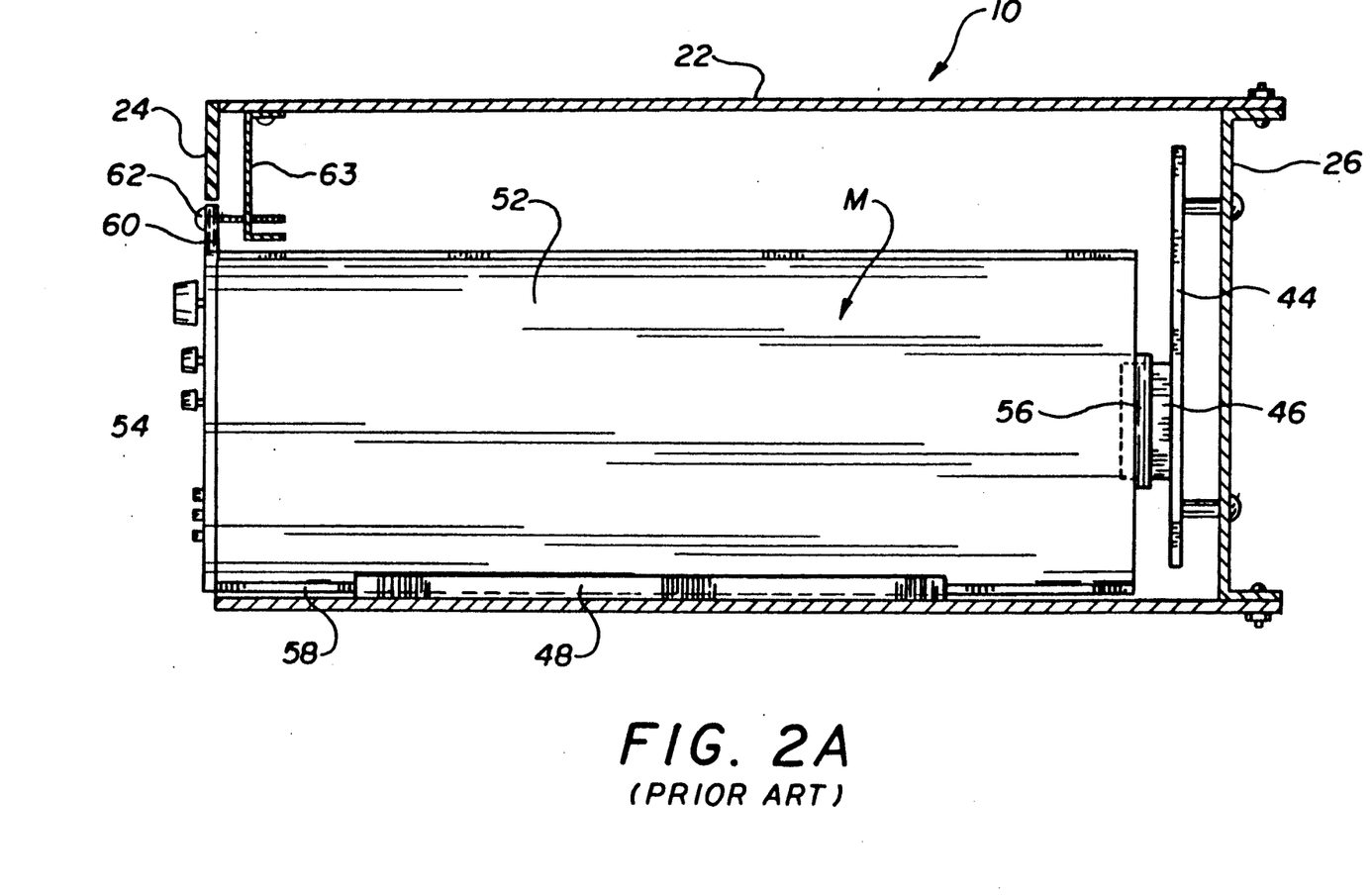
FIGS. 2A and 2B are side elevational views showing previously known arrangements for mounting electronic modules within a host instrument.
Figure 2B:
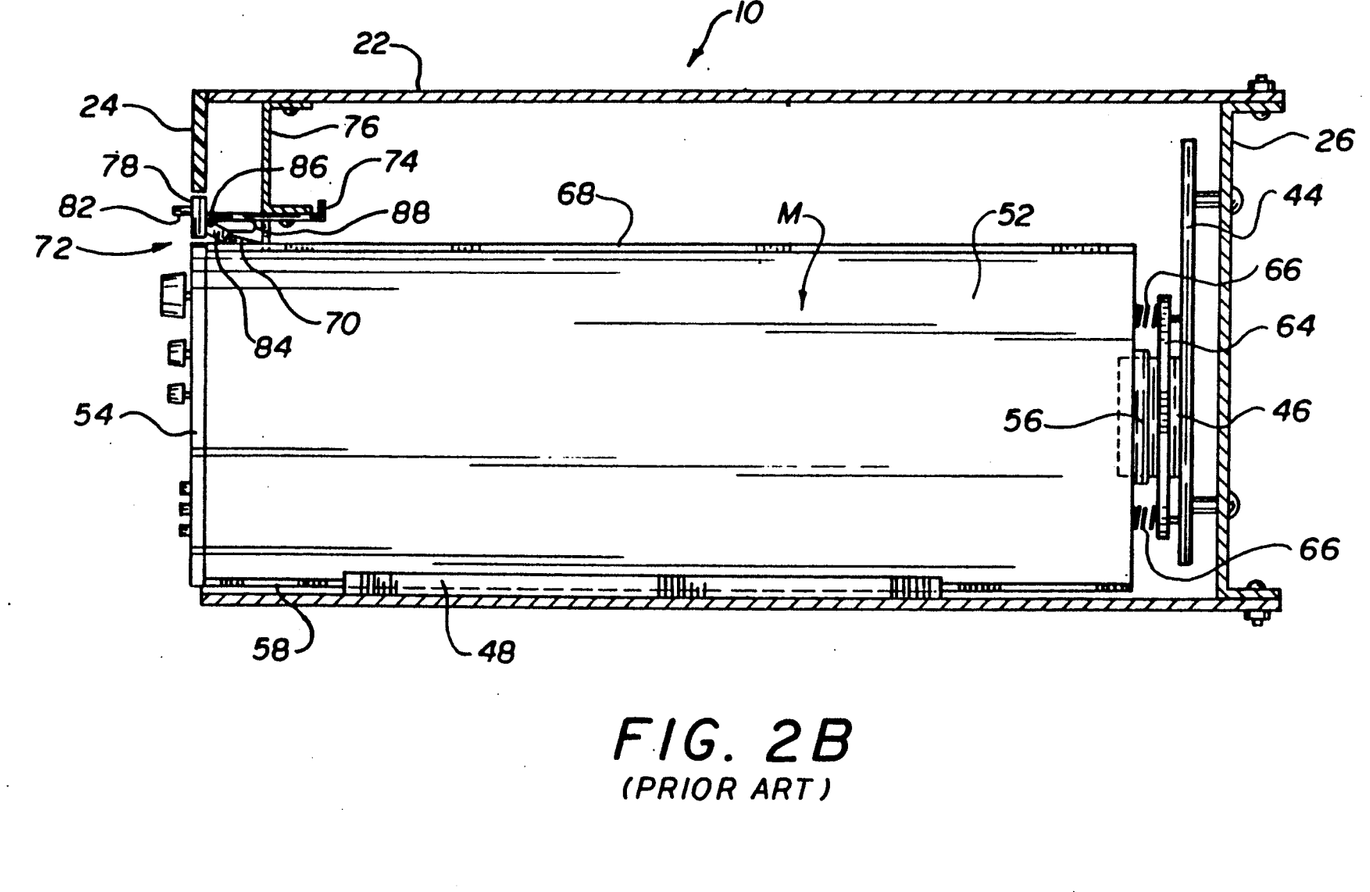

Referring now to FIGS. 2A and 2B, prior arrangements for securing module "M" to instrument 10 are shown. In both arrangements, module "M" is aligned for matingly electrical engagement between connector 56 on module "M" and connector 46 within housing 22. Module "M" is aligned within housing 22 by means of an elongated track 48 secured to housing 22. Track 48 is dimensioned to receive an elongated bottom slide rail 58 extending along the bottom of body portion 52 of module "M". Track 48 is oriented to axially align connector 56 on module "M" with connector 46 within housing 22. In this respect, as module "M" moves along track 48 in the direction of electrical engagement, i.e. to the right in FIGS. 2A, 2B, connector 56 mates with connector 46 within housing 22. In the arrangement shown in FIG. 2A, front panel 54 of module "M" includes an upward extending flange 60 having a hole (not shown) extending therethrough. A fastener 62 extends through the hole in flange 60 and is received within a mating threaded opening in a bracket 63 which is fixedly mounted within housing 22. In this respect, in the configuration shown in FIG. 2A, module "M" is maintained within housing 22 by fastener 62.

FIG. 2B discloses another, previously known arrangement for maintaining module "M" within housing 22. In this arrangement, a plate 64 having biasing springs 66 attached thereto is mounted to circuit board 44. Place 64 has an opening formed therein through which connector 46 extends. Biasing springs 66 are disposed above and below connector 46 and are operable to act against the rear portion of module "M". In this arrangement, an upper slide rail 68 is formed along the upper surface of module "M" and extends generally parallel to bottom slide rail 58. Near the front panel 54 of module "M", an upward extending projection 70 is formed on slide rail 68. A locking assembly 72 is mounted within housing 22 to interact with projection 70. Locking assembly 72 is generally comprised of a base member 74 which is secured to a bracket 76 which is fixedly mounted within housing 22. A movable panel 78 having an outward extending tab 82 and a downward extending latch 84 is mounted to base member 74 for pivotal rotation about a pin 87. A U-shaped spring 88 is provided to bias latch 84 to a downward position as shown in FIG. 2B. In this position, latch 84 engages projection 70 on module "M" and locks module "M" into position shown against the biasing force of biasing springs 66.

Figure 3:
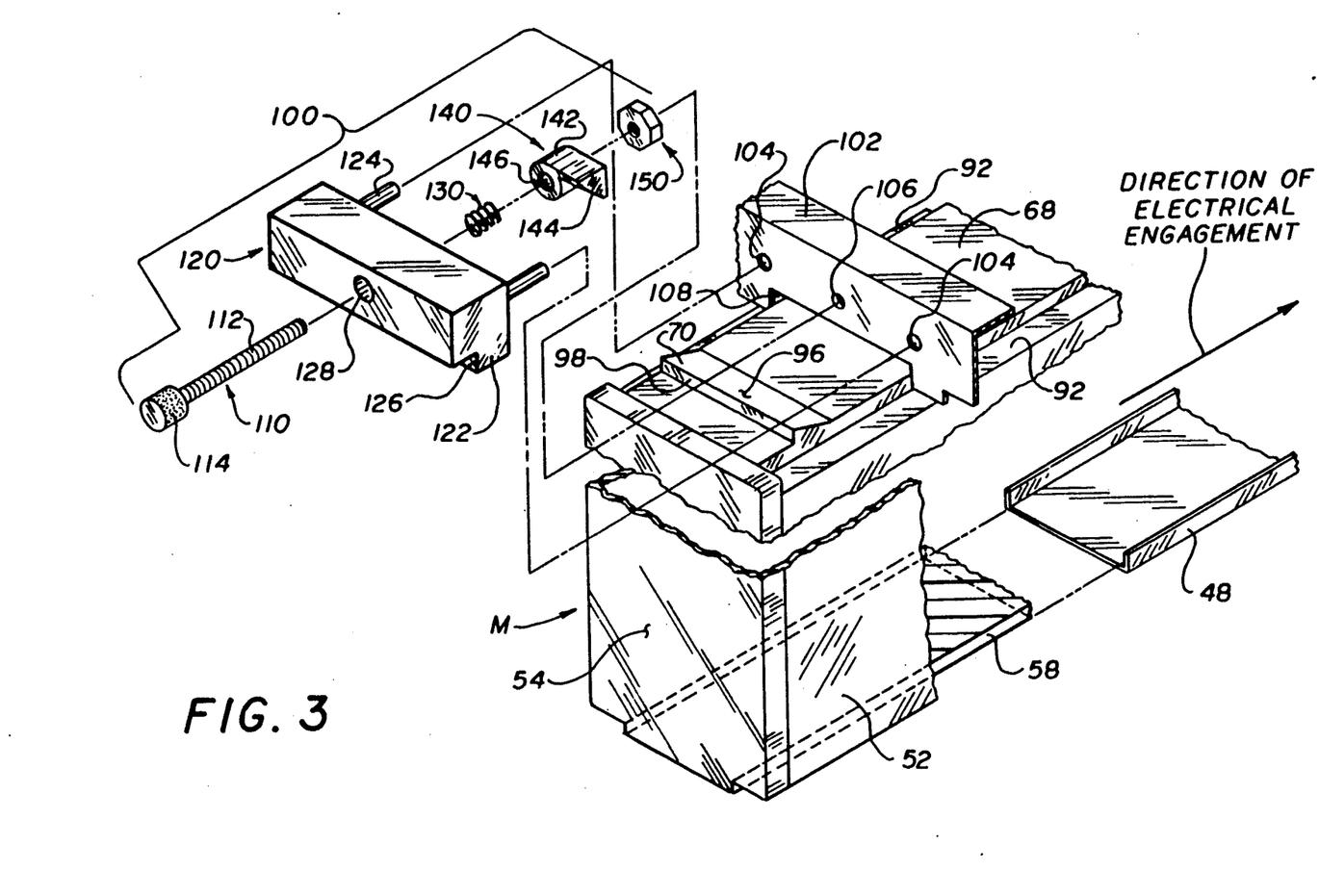
FIG. 3 is an exploded perspective view of an electronic module mounting assembly according to the present invention.

Referring now to FIG. 3, a locking assembly 100 according to one aspect of the present invention is shown. Locking assembly 100 is adapted for use with the module "M" of the type used with the mounting arrangement shown in FIG. 2B. As shown in FIG. 3, module "M" has a generally rectangular body portion 52 (shown partially sectioned) with upper and lower slide rails 68, 58 respectively extending along the upper and lower surfaces thereof. Lower slide rail 58 is dimensioned to be received within track 48. As seen in FIG. 3, a groove or notch 92 is formed along the edges of module "M" adjacent upper slide rail 68. Notches 92 extend along the length of module "M" and terminate at front panel 54. In this respect, a portion of the back surface of front panel 54, which portion is identified as surface 94 (best seen in FIG. 6) is exposed and faces in the direction of electrical engagement. As seen in FIG. 3, projection 70 which extends from upper slide rail 68 is generally wedge-shaped and includes a surface 96 which is inclined relative to the upper surface of upper slide rail 68 and a surface 98 which is oriented to be perpendicular to, and facing away from, the direction of electrical engagement of module "M". In this respect, surface 98 is generally parallel to and spaced apart from surface 94 of front panel 54.

A mounting bracket 102 (shown partially sectioned) is provided and dimensioned to be secured within housing 22 by conventional means (not shown). Bracket 102 includes two spaced-apart aligning apertures 104. Between aligning apertures 104 a threaded opening 106 is provided. A generally rectangular notch 108 dimensioned to receive upper slide rail 68 of module "M" is formed in the lower edge of bracket 102. Notch 108 has a width which is slightly greater than the width of upper slide rail 68 wherein notch 108 is operable, together with track 48, to align module "M" relative to the connector 46 within housing 22.

Referring now to locking assembly 100, assembly 100 is generally comprised of a fastener element 110, a locking/extractor block 120, a friction element 130, a movable latching pawl 140 and a securing element 150. More specifically, in the embodiment shown, fastener element 110 includes an elongated threaded shank 112, an enlarged knurled head portion 114. Locking/extractor block 120 has an elongated, generally rectangular shape and a length dimensioned to traverse the width of module "M". The ends of block 120 include two downward extending leg portions 122 (best seen in FIG. 4) and a pair of laterally extending aligning pins 124. Leg portions 122 are dimensioned and spaced apart to be received within grooves 92 which extend along module "M", and pins 124 are dimensioned and spaced-apart to be received within aligning apertures 104 on bracket 102. Locking/extractor block 120 is preferably formed of a tough, durable, high impact plastic material with leg portions 122 and aligning pins 124 being formed as an integral part thereof.

Figure 5A:
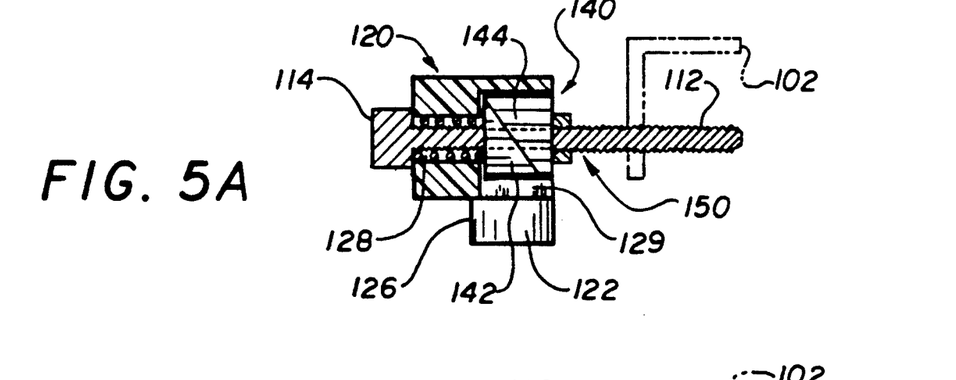
FIG. 5A is a sectional view taken along line 5A—5A of FIG. 4.
Figure 5B:
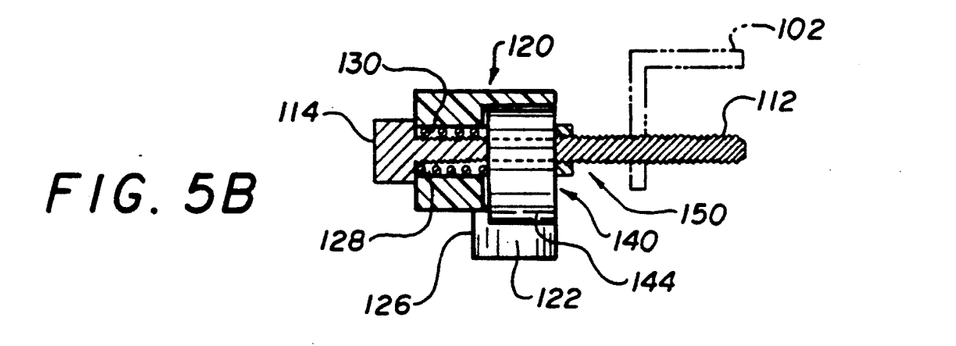
FIG. 5B is a sectional view as shown in FIG. 5A illustrating the latching pawl of the mounting assembly in a "down" module engaging position.

Importantly, each leg portion 122 includes a front or forward facing extractor surface 126 oriented to abut surface 94 of front panel 54 of module "M". A cylindrical bore 128 extends through block 120 and communicates with a recess 129 formed within block 120. Bore 128 is dimensioned to receive threaded shank 112 of fastener 110 (as best illustrated in FIGS. 5A, 5B). In this respect, bore 128 has a diameter greater than the diameter of threaded shank 112, yet smaller than the knurled head portion 114 of fastener 110. Recess 129 is dimensioned to receive latching pawl 140 therein. Pawl 140 is generally comprised of a cylindrical body portion 142 having a wedge-shaped latch portion 144 extending laterally therefrom. A bore 146 extends through cylindrical portion 142 of pawl 140 and is dimensioned to freely receive threaded shank portion 112 of fastener element 110 and to be freely rotatable thereon. According to the present invention, latch pawl 140 is preferably formed of a tough, durable, high impact plastic material. Latching pawl 140 is mounted on fastener element 110 by securing element 150. As best seen in FIGS. 5A, 5B, frictional element 130 is disposed within bore 146 of locking extractor block 140 between knurled head 114 of fastener element 110 and pawl 140. In the embodiment shown, frictional element 130 is a helical compression spring which is dimensioned to be maintained under compression between latching pawl 140 and knurled head 114 of fastener 110. Locking element 150 is preferably fixedly attached to threaded shank 112 to maintain the relative position of the respective components. In the embodiment shown, locking element 150 is a standard hexagonal nut which is secured to shank portion 112 by an adhesive, such as Locktite ™.

Figure 4:
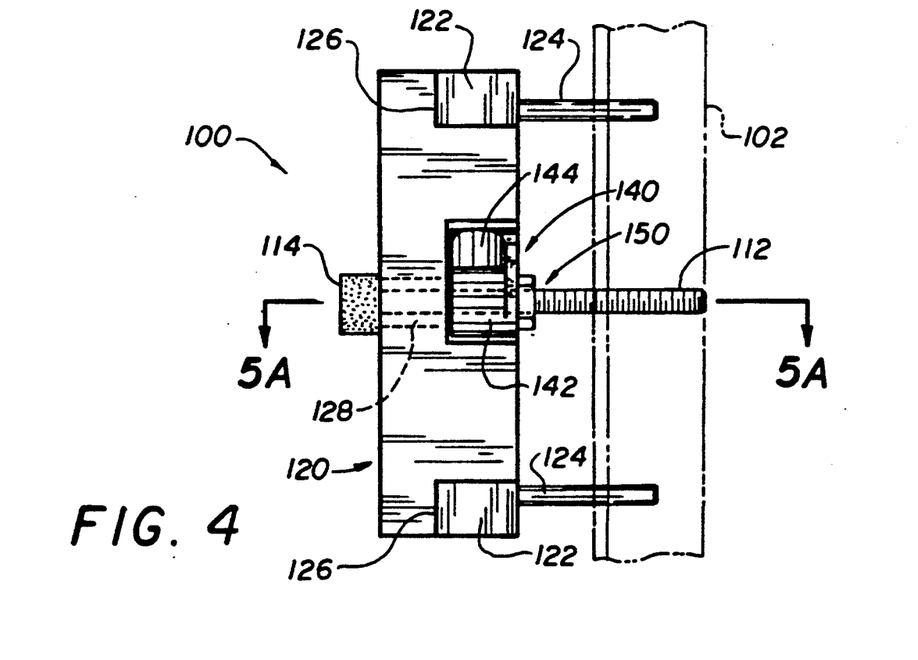
FIG. 4 is an enlarged bottom plan view of the locking/extractor block shown in FIG. 3.

According to the present invention, friction element 130 is preferably compressed by locking element 150 such that rotation of fastener element 110 will cause rotation of latching pawl 140 therewith as a result of the frictional force exerted by frictional element 130 between knurled head 114 of fastener 110 and pawl 140. Movement of latching pawl 140 is limited by the shape of recess 129 as best illustrated in FIG. 4. Specifically, latching pawl 140 is movable between a first position wherein latch portion 144 extends and is generally parallel with the axis of locking/extractor block 120 (see FIGS. 4 and 5A) and a second position wherein latch portion 144 extends downward, generally perpendicular to the axis of locking/extractor block member 120 (see FIG. 5B). In this respect, latching pawl 140 is rotatable through an angle of about 90°. Importantly, because latching pawl 140 is freely mounted on fastener element 110, rotation of fastener element 110 is not limited by latching pawl 140 and fastener element 110 is freely rotatable in locking/extractor block 110 and may rotate beyond the limits of latching pawl 140.

Referring now to the operation of the present invention, locking assembly 100 is attached to bracket 102 by threading shank portion 112 into threaded opening 106 of bracket 102. Pins 124 are received within aligning apertures 104 of bracket 102 to orient locking assembly 100 within housing 22. According to the present invention, rotation of threaded fastener 110 in a clockwise direction causes latching pawl 140 to move to its second position (as shown in FIG. 5B) as a result of the frictional force exerted on the pawl by friction element 130. Importantly, once latching pawl 140 has been rotated to its second position, further rotation of fastener element 110 is not prevented. In this respect, fastener 110 may be continuously threaded into bracket 102 by continued rotation of fastener element 110 in a clockwise direction.

Figure 6:
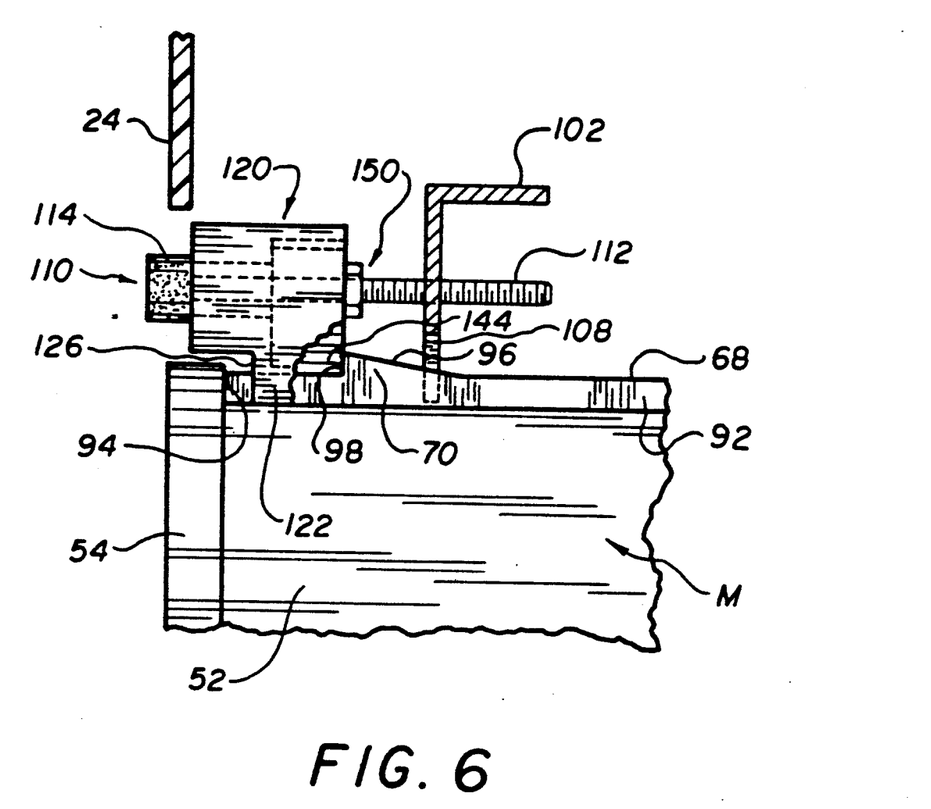
FIG. 6 is an enlarged elevational view showing the mounting assembly and electronic module in operative engagement.

To secure a module "M" within instrument 10, the lower slide rail 58 of module "M" is aligned within track 48 and the upper slide rail 68 is aligned within notch 108 of bracket 102. With module "M" aligned within track 48, it may be inserted into housing 22. Notch 108 in bracket 102 permits the wedge-shaped projection on the upper surface of upper slide rail 68 to pass beneath bracket 102. With respect to latching pawl 140, in the event that latching pawl 140 is in its second position, incline surface 96 of projection 70 engages the wedge-shaped latch portion 144. The engagement of the respective inclined surfaces is sufficient to cause latching pawl 140 to rotate toward its first position, such that projection 70 may pass beneath locking assembly 100. Once projection 70 has passed latching pawl 140, initial contact between connector 56 of module "M" and connector 46 within housing 22 will occur. Final engagement between the connector pins within the respective connectors can be accomplished utilizing locking assembly 100. In this respect, knurled head 114 of fastener element 110 may be turned in a clockwise direction to urge locking assembly 100 toward bracket 102. In this respect, rotation of fastener element 110 in a clockwise direction causes latching pawl 140 to move to its second position as a result of the frictional force exerted by friction element 130 thereon. In this respect, latching pawl 140 assumes a position as shown in FIG. 6, wherein latching portion 144 engages surface 98 of projection 70. In this respect, as fastener element 110 is continuously threaded into bracket 102, latching pawl 140 acting on surface 98 of projection 70 gradually urges module "M" into electrical engagement between connectors 46, 56. Thus, connection between module "M" and circuit 44 within housing 22 occurs by a gradual biasing rather than a quick, sudden thrust which can damage the multi-pin connectors.

With respect to removal of module "M", removal occurs by rotating fastener element 110 in a counter-clockwise direction. In this respect, rotation of fastener elements 110 in a counter-clockwise direction causes latching pawl 140 to rotate to its first position wherein it no longer obstructs the path of projection 70 on module "M" and would permit removal of module "M" from housing 22. More importantly, rotation of fastener element 110 in a counter-clockwise direction causes locking assembly 110 to move away from bracket 102. In this respect, surfaces 126 on leg portions 122 engage surface 94 on front panel 54 of module "M" wherein continued rotation of fastener element 110 in a counter-clockwise direction gradually withdraws module "M" from electrical engagement with housing 22.

Thus, the present invention provides a locking assembly for locking a module within a host instrument wherein the locking assembly may be mounted within the host instrument and facilitates gradual engagement and withdrawal of the module from electrical connection with the housing.

The present invention has been described with respect to a preferred embodiment. Modifications and alterations will occur to others upon their reading and understanding of the specification. It is intended that all such modifications and alterations be included insofar as they come within the scope of the patent as claimed or the equivalents thereof.

Thus, having described the invention, the following is claimed:

1. An assembly for mounting an electronic module within a electrical instrument, said electronic module having an electrical connector extending therefrom for engagement with an electrical connector within said instrument, said assembly comprising:
    aligning means for aligning said module within said housing along a path said module being movable in a direction for electrical engagement with said instrument when said module moves in one direction along said path and being movable in a direction out of electrical engagement with said instrument when said module moves in the opposite direction along said path,
    first surface means on said module, said first surface means being oriented so as to be generally transverse to and facing said direction out of electrical engagement,
    second surface means on said module, said second surface means being spaced apart from said first surface means and being generally transverse to and facing said direction for electrical engagement, and
    a locking assembly for moving said module along said path and for releasably holding said module within said instrument, said assembly including:
        a body,
        reversible fastening means for mounting said body to said instrument, said fastening means being movable to a first direction to gradually urge said body in said direction for electrical engagement and being movable in a second direction to gradually urge said body in said direction out of electrical engagement, a latch member associated with said fastening means, said latch member being movable to a first position wherein said latch member is aligned to engage said first surface means on said module and to move said module in said direction for electrical engagement when said fastening means moves in said first direction and urges said body in said direction for electrical engagement, and a second position wherein said latch member is removed from alignment with said module when said fastening means moves in said second direction and urges said body in said direction out of electrical engagement, and extractor surface means on said body positioned to engage said second surface means on said module and to move said module in said direction out of electrical engagement when said fastening means urges said body in said direction out of electrical engagement.

2. An assembly as defined in claim 1 wherein said latch member is attached to said fastening means and a frictional element operably engages said fastening means and said latch member.

3. An assembly as defined in claim 2 wherein:
said fastening means is a threaded fastener,
said latch member is rotatably mounted on said threaded fastener, and
said frictional element is a helical compression spring.

4. An assembly as defined in claim 3 wherein said body portion includes a bore extending therethrough, said bore aligned with said direction for electrical engagement and communicating with a recess in said body portion, said bore being dimensioned to receive said threaded fastener and said compression spring therein and said recess being dimensioned to receive said latch member and limit movement of said latch member between said first position and said second position.

5. An assembly as defined in claim 4 wherein said threaded fastener has a knurled head portion dimensioned to be external of said body portion and an elongated threaded shank dimensioned to be threadably received in an opening in said housing.

6. An electronic module housing assembly for releasably retaining an electronic module within a host instrument comprising:
an electronic module dimensioned to be received in said host instrument and to be movable in a predetermined direction for electrical engagement with said host instrument, said module including first surface means facing opposite said direction to electrical engagement and second surface means being spaced apart from said first surface means and facing said direction of electrical engagement, and a locking assembly mountable to said host instrument for releasably holding said module within said host instrument said locking assembly including:
a locking/extractor member,
a reversible fastening means for mounting said locking/extractor member to said host instrument, said fastening means being movable in a first direction to gradually urge said locking/extractor member in said direction of electrical engagement and movable in a second direction to gradually urge said locking/extractor member in a direction opposite said direction of electrical engagement, a latch member movable between a first position wherein said latch member engages said first surface means on said module and moves said module in said direction of electrical engagement when said fastening means urges said locking/extractor member in said direction of electrical engagement, and a second position wherein said latch member is removed from engagement with said module when said fastening means moves in said second direction to gradually urge said locking/extractor member in said direction opposite to said direction of electrical engagement, and extractor means on said locking/extractor member operable to engage said second surface means on said module when said fastening means moves in said second direction and to urge said locking/extractor member in said direction opposite said direction for electrical engagement, said extractor means gradually urging said module in said direction opposite said direction for electrical engagement as said locking/extractor member moves in said direction opposite said direction for electrical engagement.

7. A mounting assembly as defined in claim 6 wherein said locking/extractor member is an elongated, generally rectangular, block including two laterally extending leg portions defining said extractor surface means.

8. A mounting assembly as defined in claim 7 further comprising means for aligning said block generally transverse to the direction of engagement with said leg portions positioned to slidably engage said module.

9. A mounting assembly as defined in claim 7 wherein said locking/extractor member includes a bore extending therethrough in the direction of engagement, and said fastening means is an elongated threaded fastener dimensioned to extend through said locking/extractor member and be received in a threaded opening in said host instrument, rotation of said threaded fastener operable to move said locking/extractor member relative to said host instrument.

10. A mounting assembly as defined in claim 9 wherein said latch member is mounted to threaded fastener for limited rotation therewith.

11. A mounting assembly as defined in claim 10 wherein said locking assembly further comprises a frictional element disposed between said threaded fastener and said latch member, said frictional element operable to cause said latch member to rotate with said threaded fastener due to frictional engagement therebetween.

12. A locking assembly for releasably securing an electronic module within a host instrument and for reciprocally moving said module along a path into and out of electrical engagement with said host instrument, said locking assembly comprising:
a body portion,
means for aligning said body portion relative to said host instrument,
reversible fastening means associated with said body portion for mounting said body portion to said host instrument, said fastening means being operable to gradually urge said body portion in a first direction corresponding to the direction of electrical engagement between said module and said host instrument, a latch member mounted to said fastening means, said latch member being disposed adjacent said body portion and being movable relative thereto, a frictional element disposed between said fastening means and said latch element, said frictional element being in frictional engagement with said fastening means and said latch member operable to cause said latch member to move with said fastening means as a result of said frictional engagement, means for limiting movement of said latch member relative to said body portion between a first position wherein said latch member projects outward from said body portion and is positioned to engage a first surface on said module and a second position removed from alignment with said module, said latch member being movable to said first position when said fastening means urges said body portion in said first direction and being movable to said second position when said fastening means urges said body portion in a direction opposite said first direction.

13. A locking assembly as defined in claim 12 further comprising an extractor on said body portion dimensioned to engage a second surface on said module when said fastening means urges said body portion in a direction opposite said first direction, said extractor projecting from said body portion.

14. A locking assembly as defined in claim 13 wherein said fastening means is a threaded fastener extending through said body portion along an axis aligned with said first direction sand said frictional element is a helical compression spring mounted on said threaded fastener.

* * * * *